(12) United States Patent
Oka et al.

(10) Patent No.: US 8,304,882 B2
(45) Date of Patent: Nov. 6, 2012

(54) POWER SEMICONDUCTOR DEVICE

(75) Inventors: Seiji Oka, Tokyo (JP); Yoshihiro Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 142 days.

(21) Appl. No.: 12/790,254

(22) Filed: May 28, 2010

(65) Prior Publication Data
US 2011/0049531 A1    Mar. 3, 2011

(30) Foreign Application Priority Data

Aug. 27, 2009    (JP) ................................. 2009-196228

(51) Int. Cl.
    *H01L 23/24*    (2006.01)
(52) U.S. Cl. ................. 257/687; 257/E23.116; 438/127
(58) Field of Classification Search ................. 257/678, 257/687, 691, 706, 719, 723, E23.116; 438/127
    See application file for complete search history.

(56) References Cited

U.S. PATENT DOCUMENTS

| | | | | |
|---|---|---|---|---|
| 5,665,652 | A * | 9/1997 | Shimizu | 438/127 |
| 6,597,063 | B1 * | 7/2003 | Shimizu et al. | 257/687 |
| 6,926,789 | B2 * | 8/2005 | Higashitani | 156/230 |
| 6,982,482 | B2 * | 1/2006 | Glidden et al. | 257/723 |
| 2004/0007772 | A1 * | 1/2004 | Arai et al. | 257/691 |
| 2004/0028894 | A1 * | 2/2004 | Ueno et al. | 428/343 |
| 2004/0057208 | A1 * | 3/2004 | Baeumel et al. | 361/688 |
| 2004/0256720 | A1 * | 12/2004 | Yap et al. | 257/720 |
| 2005/0287350 | A1 * | 12/2005 | Crouthamel et al. | 428/321.1 |
| 2007/0215999 | A1 * | 9/2007 | Kashimoto et al. | 257/678 |
| 2007/0235860 | A1 * | 10/2007 | Steger et al. | 257/706 |
| 2008/0064331 | A1 * | 3/2008 | Washiro | 455/41.1 |
| 2009/0057929 | A1 * | 3/2009 | Sasaki et al. | 257/796 |
| 2009/0261472 | A1 * | 10/2009 | Bayerer | 257/719 |
| 2010/0013085 | A1 | 1/2010 | Oi et al. | |
| 2010/0013086 | A1 | 1/2010 | Obiraki et al. | |
| 2010/0117219 | A1 | 5/2010 | Oka et al. | |

FOREIGN PATENT DOCUMENTS

| | | |
|---|---|---|
| JP | 8-204064 | 8/1996 |
| JP | 2007-184315 | 7/2007 |
| JP | 2008-294275 | 12/2008 |
| JP | 2009-059812 | 3/2009 |

OTHER PUBLICATIONS

U.S. Appl. No. 13/008,470, filed Jan. 18, 2011, Yamaguchi, et al.
U.S. Appl. No. 13/020,235, filed Feb. 3, 2011, Yamaguchi.
Chinese Office Action issued Mar. 12, 2012, in China Patent Application No. 201010268811.1 (with English translation).
Office Action issued Jul. 18, 2012, in Patent Application No. 2009-196228, filed Aug. 27, 2009, (w/partial English translation).

* cited by examiner

*Primary Examiner* — William F Kraig
(74) *Attorney, Agent, or Firm* — Oblon, Spivak, McClelland, Maier & Neustadt, L.L.P.

(57)    ABSTRACT

Provided is a power semiconductor device including: an insulating substrate; a circuit pattern formed on an upper surface of the insulating substrate; a power semiconductor formed on the circuit pattern; a plurality of metal socket electrode terminals formed perpendicularly to the circuit pattern or the power semiconductor so as to be in conduction with external terminals; an integral resin sleeve in which a plurality of sleeve parts are integrated, the plurality of sleeve parts being fitted with the plurality of metal socket electrode terminals from above the plurality of metal socket electrode terminals and having openings at both ends thereof; and a molding resin covering the insulating substrate, the circuit pattern, the power semiconductor, the electrode terminals, and the integral resin sleeve.

15 Claims, 16 Drawing Sheets

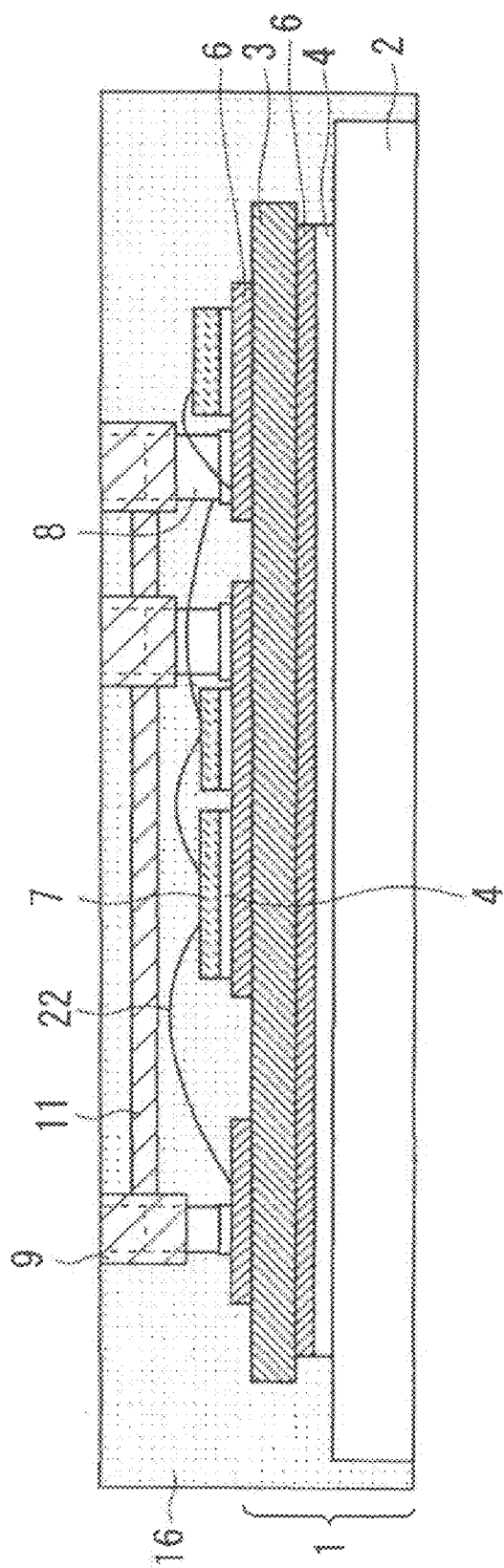

F I G. 1 1
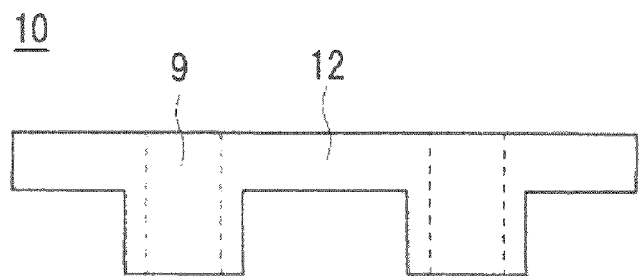
F I G. 1 2
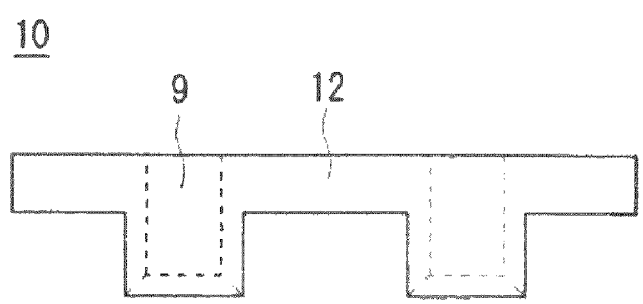
F I G. 1 3
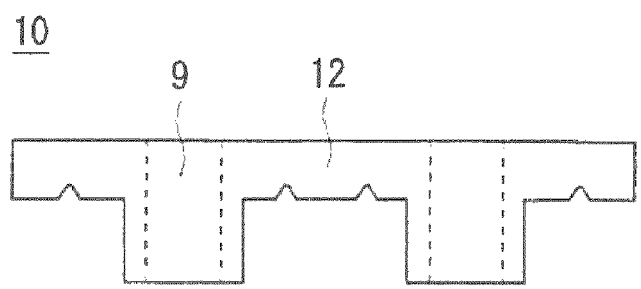

F I G . 1 4
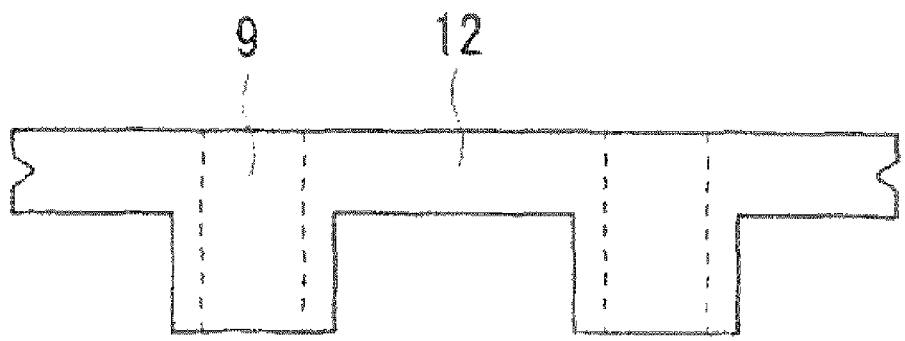
F I G . 1 5
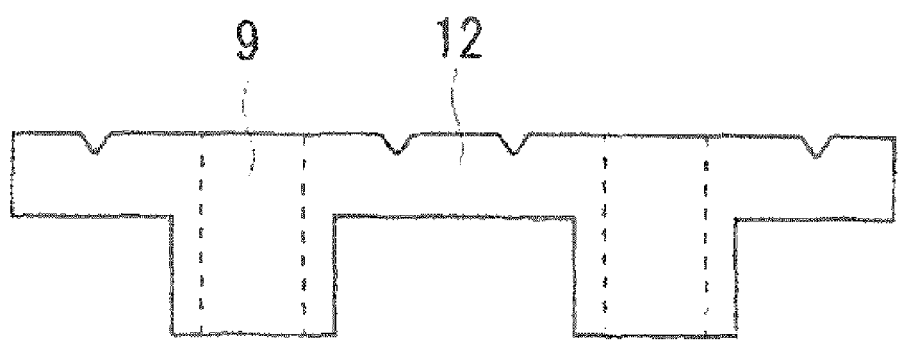

POWER SEMICONDUCTOR DEVICE

BACKGROUND OF THE INVENTION

1. Field of the Invention

The present invention relates to a transfer-molding type power semiconductor device and a manufacturing method for the same, and more particularly, to a power semiconductor device in which metal socket electrode terminals for top-exposed electrodes are arranged perpendicularly to an insulating substrate and a manufacturing method for the same.

2. Description of the Background Art

In many cases, typical semiconductor packages are formed by resin sealing including transfer-molding in terms of manufacturing cost, productivity or the like. In the transfer molding, a resin composition (molding resin) is melted by high-frequency heating as required, and then is filled into a hollow (cavity) inside a metal mold kept at high temperature. The metal mold is typically composed of an upper mold and a lower mold combined therewith, and the cavity is defined by inner walls of the upper and lower molds. A plunger is used for filling of the molding resin and the following pressurization of the molding resin, where the molding resin is heat-melted to be filled in the cavity and then is cured. The molding resin is filled in the cavity in a state where mold clamping is performed, and then a semiconductor device which is resin-sealed with a molding resin is manufactured by a known method.

In transfer molding, a metal electrode terminal such as a lead frame is sandwiched in the state of being in contact with the upper and lower molds during mold clamping, and accordingly the metal electrode terminal is exposed to an outside of the resin even after the resin is sealed. The metal electrode terminal described herein is exposed to an outside of the package after the transfer molding to be electrically connected with the outside of the package. In a case where a lead frame is used as the metal electrode terminal, the terminal is typically formed as an external terminal on a periphery of side surfaces of the package molded with a molding resin. However, considering that a plurality of packages are mounted on a printed wiring board at high density to miniaturize a system and a semiconductor device, the metal electrode terminal is desirably exposed to upper surfaces (in a direction perpendicular to a surface of an insulating substrate) of the packages, not to the side surfaces (in a direction parallel to the surface of the insulating substrate) of the packages.

Japanese Patent Application Laid-Open No. 08-204064 discloses a configuration in which metal electrode terminals are exposed in a side surface direction of a package, and Japanese Patent Application Laid-Open No. 2007-184315 discloses a configuration in which metal electrode terminals are exposed in an upper surface direction of a package.

In a transfer-molding type power semiconductor device, electrode terminals are mounted perpendicularly to the insulating substrate in a case where the electrode terminals are exposed to the upper surface of the molding resin (in a direction perpendicular to the surface of the insulating substrate). One end of the electrode terminal is bonded to a circuit pattern and an electrode of a semiconductor element, while the other end thereof needs to be exposed to an outside of the molding resin. Therefore, in mold clamping of the semiconductor device with the upper and lower molds, an end of the metal electrode terminal, which is not bonded to the insulating substrate, needs to be in contact with an inner wall of the mold.

However, if a total thickness from the insulating substrate to a tip of the metal electrode terminal is larger than a length of an inside of a cavity in a longitudinal direction, unfortunately, internal components are damaged by mold clamping. On the other hand, if the total thickness is smaller than the length of the inside of the cavity in the longitudinal direction, the other end of the metal terminal electrode is not brought into contact with the inner wall of the mold in mold clamping. As a result, the metal electrode terminal is not exposed to the outside of the molding resin after injection of the molding resin, which makes it unable to connect an external terminal.

In order to avoid such problems, it is required to strictly control accuracy of dimension of internal components such as an insulating substrate, a power semiconductor, a metal electrode terminal, solder, and a mold, which causes an increase in manufacturing cost or a decrease in yield.

In the case where the metal electrode terminals are formed so as to be exposed from a top of the molding resin, the electrodes can be arranged in proximity to each other on the same surface compared with the case where the metal electrode terminals are exposed from a side surface of the molding resin. Accordingly, the electrodes can be arranged in high density, which is advantageous to miniaturization of a power semiconductor device. Nevertheless, creeping discharge occurs if a creeping distance between the metal electrode terminals is excessively small, and hence the creeping distance imposes a limitation on further miniaturization.

SUMMARY OF THE INVENTION

An object of the present invention is to provide a power semiconductor device having a top-exposed electrode structure without strictly controlling dimensions of internal components and molds, and a manufacturing method for the same. Another object of the present invention is to provide a power semiconductor device capable of being miniaturized by increasing a creeping distance between metal electrode terminals, and a manufacturing method for the same.

A power semiconductor device according to the present invention includes an insulating substrate, a circuit pattern, a power semiconductor, a plurality of electrode terminals, an integral resin sleeve, and a sealing resin. The circuit pattern is formed on an upper surface of the insulating substrate. The power semiconductor is formed on the circuit pattern. The electrode terminals are formed perpendicularly to the circuit pattern or the power semiconductor so as to be in conduction with external terminals. The integral resin sleeve is formed by integrating a plurality of sleeve parts, the plurality of sleeve parts being respectively fitted with the plurality of electrode terminals from above the plurality of electrode terminals and having openings at both ends thereof. The sealing resin covers the insulating substrate, the circuit pattern, the power semiconductor, the electrode terminals, and the integral resin sleeve.

The integral resin sleeve fitted with the electrode terminals protects the electrode terminals from a pressure of the mold in a manufacturing process, whereby it is possible to manufacture a power semiconductor device having a top-exposed electrode structure without strictly controlling dimensions of the internal components and the molds.

A manufacturing method for a power semiconductor device according to the present invention includes the steps of: (b) arranging an integral resin sleeve formed by integrating a plurality of sleeve parts so that the sleeve parts are respectively fitted with a plurality of electrode terminals, the plurality of sleeve parts including openings at both ends in an extending direction of the plurality of electrode terminals; (c) press-fitting the sleeve parts to the electrode terminals by performing mold clamping on molds to apply a force downward on the integral resin sleeve; and (d) filling a molding resin into a hollow (cavity) of the molds in a state in which upper surfaces of the sleeve parts are in contact with an inner wall of the mold.

The integral resin sleeve being in contact with the molds in the step of performing mold clamping is fitted with the electrode terminals, and then the resin is filled. Accordingly, it is possible to manufacture a power semiconductor device having a top-exposed electrode structure without strictly controlling dimensions of the internal components and the molds.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view of a power semiconductor device according to a first preferred embodiment;

FIG. 11 is a sectional view of an integral resin sleeve according to the second preferred embodiment;

FIG. 12 is a sectional view of a variation of the integral resin sleeve according to the second preferred embodiment;

FIG. 13 is a sectional view of another variation of the integral resin sleeve according to the second preferred embodiment;

FIG. 14 is a sectional view of still another variation of the integral resin sleeve according to the second preferred embodiment;

FIG. 15 is a sectional view of yet still another variation of the integral resin sleeve according to the second preferred embodiment;

DESCRIPTION OF THE PREFERRED EMBODIMENTS

First Preferred Embodiment (Configuration)

Figure 2:
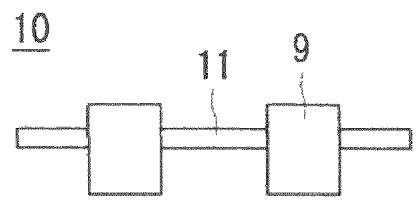
FIG. 2 shows a configuration of an integral resin sleeve according to the first preferred embodiment.

FIG. 1 shows an example of a sectional view of a power semiconductor device according to a first preferred embodiment. The power semiconductor device according to the first preferred embodiment includes an insulating substrate 1 on which a circuit pattern 6 is formed, a power semiconductor 7 and metal socket electrode terminals 8 which are formed on the circuit pattern 6 of the insulating substrate 1, and an integral resin sleeve 10 fitted with the metal socket electrode terminals 8.

The insulating substrate 1 is composed of a base plate 2 and a ceramic substrate 3 formed through solder 4 on the base plate 2. The base plate 2 functions as a heat spreader for promoting heat dissipation of the power semiconductor 7 or the like, and a back surface thereof is exposed from a molding resin 16. For example, aluminum (Al), copper (Cu), aluminum silicon carbide (AlSiC), copper-molybdenum (Cu—Mo) or the like is used as a material therefor.

That is, the insulating substrate 1 has a multi-layer structure with the undermost layer thereof being a base plate made of metal, and the back surface of the base plate is exposed from the molding resin 16. Accordingly, heat dissipation of the power semiconductor 7 or the like is promoted.

The circuit pattern 6 is formed on the ceramic substrate 3, and components such as the power semiconductor 7 and a chip resistor are bonded to the circuit pattern 6 with the solder 4. An aluminum wire 22 is used in bonding between the power semiconductors 7 or between the power semiconductor 7 and the circuit pattern 6. In the present embodiment, the power semiconductor 7 is an insulated gate bipolar transistor (IGBT) or a diode formed of a silicon material. In addition, the metal socket electrode terminals 8 are bonded, with the solder 4, to the circuit pattern 6 perpendicularly to the insulating substrate 1. Those components are sealed with the transfer molding resin 16.

In FIG. 1, the metal socket electrode terminals 8 are bonded to the circuit pattern 6 of the ceramic substrate 3 perpendicularly thereto, but may be bonded to a surface of the power semiconductor 7. When the metal socket electrode terminals 8 are arranged in this manner, the aluminum wire 22 can be omitted, which enables miniaturization of the power semiconductor device.

Figure 3:
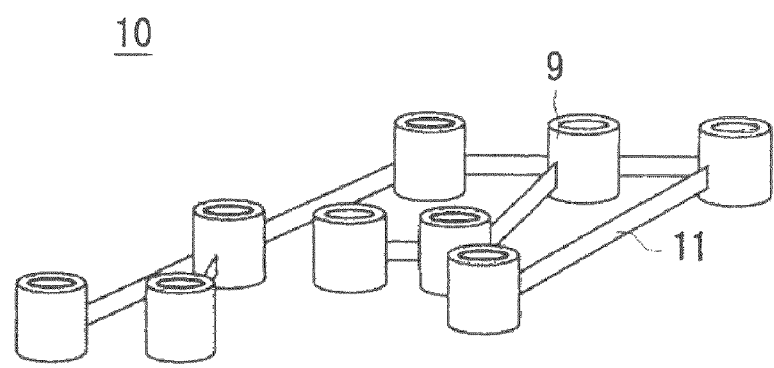
FIG. 3 is a bird's-eye view of the integral resin sleeve according to the first preferred embodiment.

The other ends of a plurality of metal socket electrode terminals 8 are respectively fitted with sleeve parts 9 of the integral resin sleeve 10. The integral resin sleeve 10 is composed of the sleeve parts 9 fitted with the metal socket electrode terminals 8 and a runner part 11 which couples the respective sleeve parts 9 to each other. FIG. 2 is a sectional view of the integral resin sleeve 10, and FIG. 3 is a bird's-eye view thereof.

The sleeve part 9 has a shape of an interference fit cylinder (hereinafter, referred to as cylinder), and covers a side surface of the metal socket electrode terminal 8 but does not cover an upper surface thereof. An inner diameter of the sleeve part 9 depends on an outer diameter of the metal socket electrode terminal 8 corresponding thereto. For example, the outer diameter of the metal socket electrode terminal 8 for a signal of low voltage and small current is small, and thus the inner diameter of the sleeve part 9 which is fitted therewith is small. On the other hand, the outer diameter of the metal socket electrode terminal 8 for a main terminal, which causes large current to flow, is designed to be large correspondingly to an amount of current, and thus the inner diameter of the sleeve part 9 which is fitted therewith is large. In this manner, the inner diameter of the sleeve part 9 is designed correspondingly to the outer diameter of the metal socket electrode terminal 8 which is fitted therewith.

That is, the power semiconductor device according to the first preferred embodiment includes: the insulating substrate 1; the circuit pattern 6 formed on an upper surface of the insulating substrate 1; the power semiconductor 7 formed on the circuit pattern 6; a plurality of electrode terminals (metal socket electrode terminals 8) formed perpendicularly to the circuit pattern 6 or the power semiconductor 7 to be in conduction with external terminals; the integral resin sleeve 10 in which a plurality of sleeve parts 9 are integrated, the plurality of sleeve parts 9 being respectively fitted with the plurality of metal socket electrode terminals 8 from above the metal socket electrode terminals 8 and having openings at both ends thereof; and the sealing resin 16 which covers the insulating substrate 1, the circuit pattern 6, the power semiconductor 7, the metal socket electrode terminals 8, and the integral resin sleeve 10. The sleeve parts 9 are fitted with the metal socket electrode terminals 8, whereby in forming a power semiconductor device by a transfer molding method, it is possible to provide a power semiconductor device having a top-exposed electrode structure without strictly controlling dimensions of internal components and a mold. Moreover, the plurality of sleeve parts 9 are integrated into the integral resin sleeve 10, whereby it is possible to easily fit the plurality of sleeve parts 9 with the metal socket electrode terminals 8 corresponding thereto.

Further, the insulating substrate 1 is composed of the base plate 2 and the ceramic substrate 3 on which the circuit pattern 6 is formed. Also with the configuration as described above, it is possible to provide a power semiconductor device having a top-exposed electrode structure without strictly controlling dimensions of the internal components and the mold.

That is, the integral resin sleeve 10 includes the sleeve parts 9 which have two or more types of different inner diameters. For this reason, it is possible to fit the integral resin sleeve 10 with the metal socket electrode terminals having different outer diameters, such as ones for both a signal and a main terminal.

Further, the upper surfaces of the sleeve parts 9 are exposed from the transfer molding resin 16.

That is, the upper surfaces of the sleeve parts 9 of the integral resin sleeve 10 are exposed from the molding resin 16. Accordingly, the molding resin 16 does not penetrate into the sleeve parts 9 or the metal socket electrode terminals 8.

The rod-like runner part 11, which couples the sleeve parts 9, is provided in the middle of the side surface of the sleeve part 9, and is embedded in the molding resin 16 by transfer molding. As a result, adhesiveness between the sleeve parts 9 and the molding resin 16 is enhanced, which improves fitting strength of the sleeve part 9 and the metal socket electrode terminal 8.

That is, the integral resin sleeve 10 includes the rod-like runner part 11 which couples the plurality of sleeve parts 9. For this reason, it is possible to obtain the flexible integral resin sleeve 10.

Further, the runner part 11 is embedded in the sealing resin (molding resin 16). For this reason, the adhesiveness between the sleeve part 9 and the molding resin 16 is enhanced, which improves the fitting strength of the sleeve part 9 and the metal socket electrode terminal 8.

Figure 4:
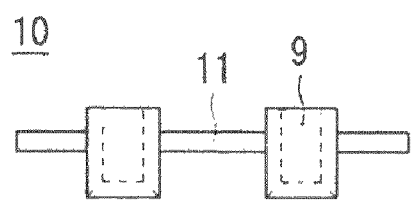
FIG. 4 shows another configuration of the integral resin sleeve according to the first preferred embodiment.

Note that the shape of the integral resin sleeve 10 shown in FIG. 2 is merely an example and, for example, a side of the sleeve part 9 which is fitted with the metal socket electrode terminal 8 may be tapered in shape, as shown in FIG. 4.

That is, an end of the sleeve part 9, which is fitted with the metal socket electrode terminal 8, is tapered in shape. Accordingly, a fitting strength of the sleeve part 9 and the metal socket electrode terminal 8 is improved.

The integral resin sleeve 10 is formed of a material whose linear expansion coefficient has a value between those of linear expansion coefficients of the molding resin 16 and the metal socket electrode terminal 8 and, for example, is formed of poly(phenylene sulfide) (PPS), polypropylene terephthalate (PPT), polybutylene terephthalate (PBT), polyethylene terephthalate (PET), nylon, polyimide, polyamide-imide, or a resin obtained by reinforcing those with glass fiber. A filler used for reinforcement, such as glass fiber, is contained in an appropriate amount so that the linear expansion coefficient has the optimum value.

That is, the linear expansion coefficient of the integral resin sleeve 10 is between the linear expansion coefficient of the molding resin 16 and the linear expansion coefficient of the metal socket electrode terminal 8. For this reason, it is possible to reduce a stress generated in the power semiconductor device in a temperature cycle, which arises from a difference in linear expansion coefficient between the molding resin 16 and the metal socket electrode terminal 8.

For example, the integral resin sleeve 10 is formed of PPS, PPT, PBT, PET, nylon, polyimide, polyamide-imide, or a resin obtained by reinforcing those with glass fiber. The linear expansion coefficient of the integral resin sleeve 10 is made to be between those of the molding resin 16 and the metal socket electrode terminal 8 using the material as described above, it is possible to reduce the stress generated in the power semiconductor device in a temperature cycle, which arises from a difference in linear expansion coefficient between the molding resin 16 and the metal socket electrode terminal 8.

Further, an inner wall of the sleeve part 9 preferably has a straight structure so as to adhere to the outer wall of the metal socket electrode terminal 8. However, the sleeve part 9 may have a circular projection on the inner wall thereof so as to be fitted with the metal socket electrode terminal 8 on a line, depending on the relationship such as crossing of two members.

That is, the sleeve part 9 includes a circular projection provided on the inner wall thereof. Accordingly, the sleeve part 9 is fitted with the metal socket electrode terminal 8 more tightly.

Figure 5:
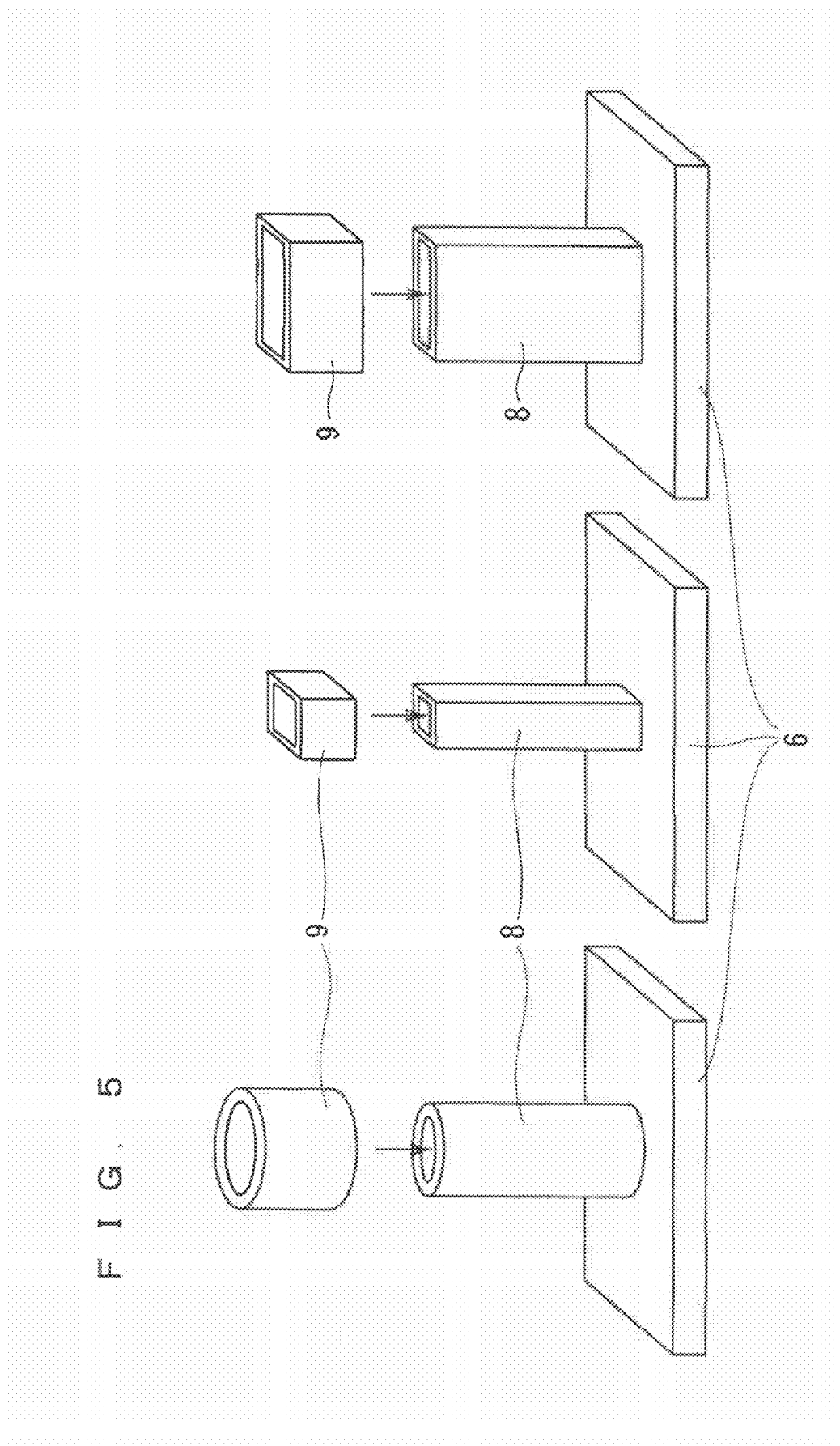
FIG. 5 is a configuration diagram of a metal socket electrode terminal and a sleeve part.

Further, various shapes of the metal socket electrode terminal 8 are conceivable as long as they are elongated, and hence the metal socket electrode terminal 8 is broadly interpreted. FIG. 5 shows an example of a conceivable shape of the metal socket electrode terminal 8. The metal socket electrode terminal 8 is appropriately selected in accordance with a shape of the external terminal inserted thereinto or crimped thereonto, and it is possible to use a cylindrical shape or a rectangular tube shape. Correspondingly to this, it is possible to use a cylindrical shape or a rectangular tube shape in the sleeve part 9 of the integral resin sleeve 10, which is fitted with the metal socket electrode terminal 8.

That is, the sleeve part 9 has a cylindrical inner shape. Accordingly, it is possible to fit the sleeve part 9 with the metal socket electrode terminal 8 which is cylindrical in shape.

Alternatively, the sleeve part 9 has an inner shape of a rectangular tube. Accordingly, it is possible to fit the sleeve part 9 with the metal socket electrode terminal 8 which has a rectangular tube shape.

Further, the power semiconductor device according to the first preferred embodiment includes external terminals (not shown) which are inserted into or crimped onto the metal socket electrode terminals 8 from openings of the sleeve parts 9. In the present embodiment, it is possible to connect the external terminals to the metal socket electrode terminals 8 in this manner.

Note that the power semiconductor 7 is an IGBT or diode formed of a silicon material, but there may be used a metal oxide semiconductor field effect transistor (MOSFET) or diode which is formed of silicon carbide (SiC) and is capable of operating at high temperature with low loss, in place of the silicon material.

That is, the power semiconductor 7 is formed of silicon carbide (SiC). Also with the configuration as described above, it is possible to provide a power semiconductor device which has a top-exposed electrode structure without strictly controlling dimensions of internal components and a mold.

(Manufacturing Step)

A manufacturing step for the power semiconductor device according to the first preferred embodiment will be described.

Figure 6:
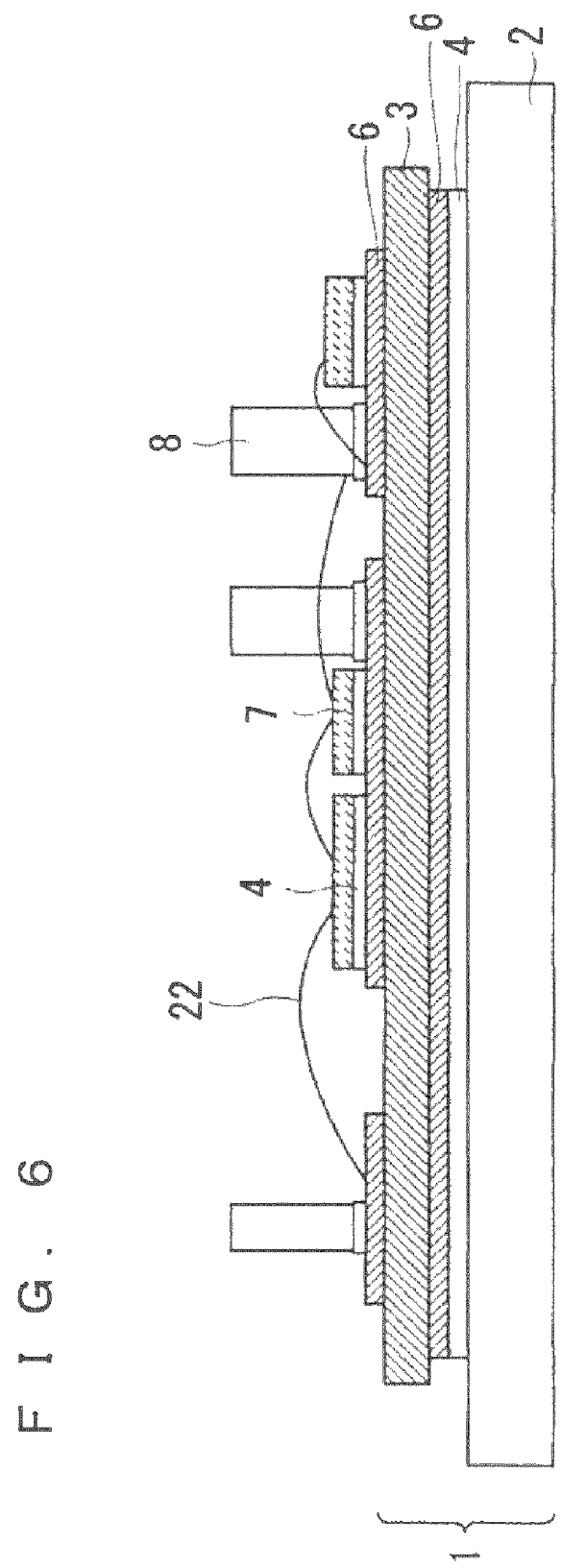
FIG. 6 is a view showing a manufacturing step for the power semiconductor device according to the first preferred embodiment.

First, the ceramic substrate 3 on which the circuit pattern 6 is formed is bonded to the base substrate 1 with the solder 4. After that, the power semiconductor 7 is formed on the circuit pattern 6 of the ceramic substrate 3. Then, the metal socket electrode terminals 8 are formed on the circuit pattern 6 or the power semiconductor 7. The metal socket electrode terminals 8 are formed so as to extend in a direction perpendicular to the ceramic substrate 3. After that, wire bonding is performed with an aluminum wire 22 between the power semiconductors 7 or between the circuit pattern 6 and the power semiconductor 7. The power semiconductor device in this state is shown in FIG. 6.

Figure 7:
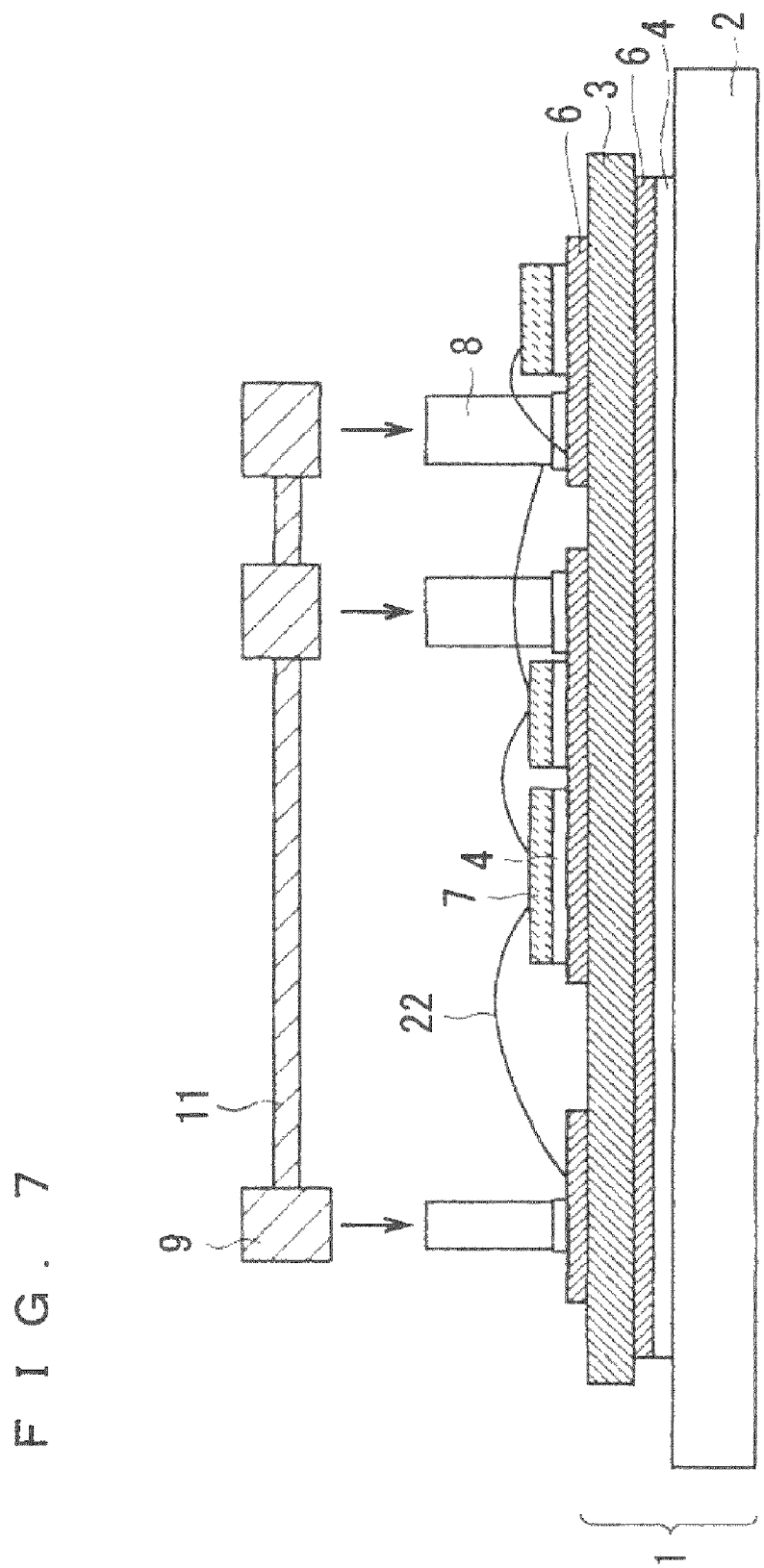
FIG. 7 is another view showing the manufacturing step for the power semiconductor device according to the first preferred embodiment.

Then, the integral resin sleeve 10 is set to the metal socket electrode terminals 8 (FIG. 7). Although the sleeve parts 9 of the integral resin sleeve 10 are fitted with the metal socket electrode terminals 8, fitting is performed in mold clamping in the subsequent step, and thus the sleeve parts 9 are temporarily fixed at this stage.

Figure 8:
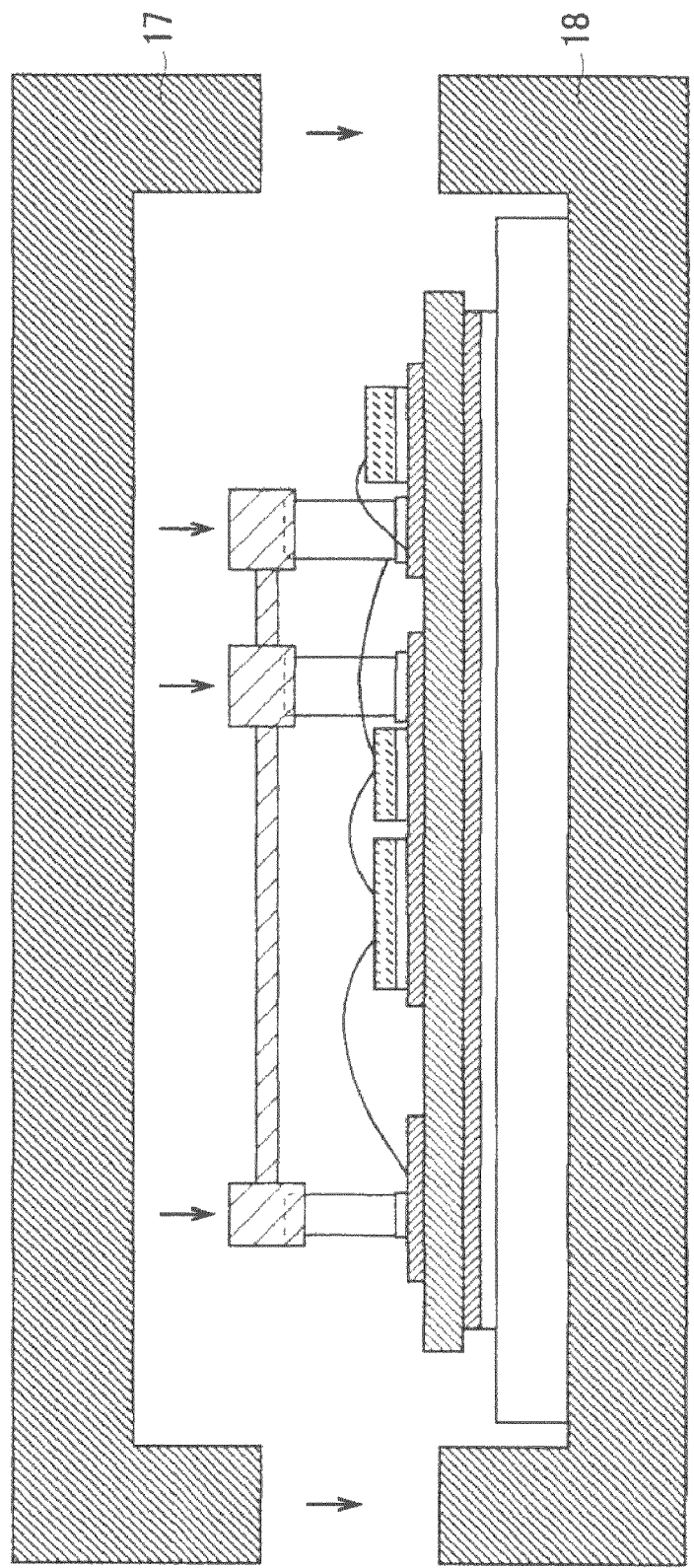
FIG. 8 is still another view showing the manufacturing step for the power semiconductor device according to the first preferred embodiment.

Then, the power semiconductor device in this state, which is a semi-finished product, is arranged in a hollow formed by an upper mold 17 and a lower mold 18, that is, a cavity 19 (see FIG. 9), to thereby perform mold clamping on the molds (FIG. 8). On this occasion, the back surface of the base plate 2 is in contact with an inner wall of the lower mold 18. In this case, a distance from an upper end of the metal socket electrode terminal 8 to the base plate 2 is smaller than a length of an inside of the cavity 19 in a longitudinal direction. The integral resin sleeve 10 is pressed downward in the step of performing mold clamping on the upper mold 17 and the lower mold 18, whereby the sleeve parts 9 are respectively fitted with the metal socket electrode terminals 8. The sleeve part 9 is, for example, cylindrical in shape, and is press-fitted to and fitted with the metal socket electrode terminal 8 in the longitudinal direction of the metal socket electrode terminal 8.

Figure 9:
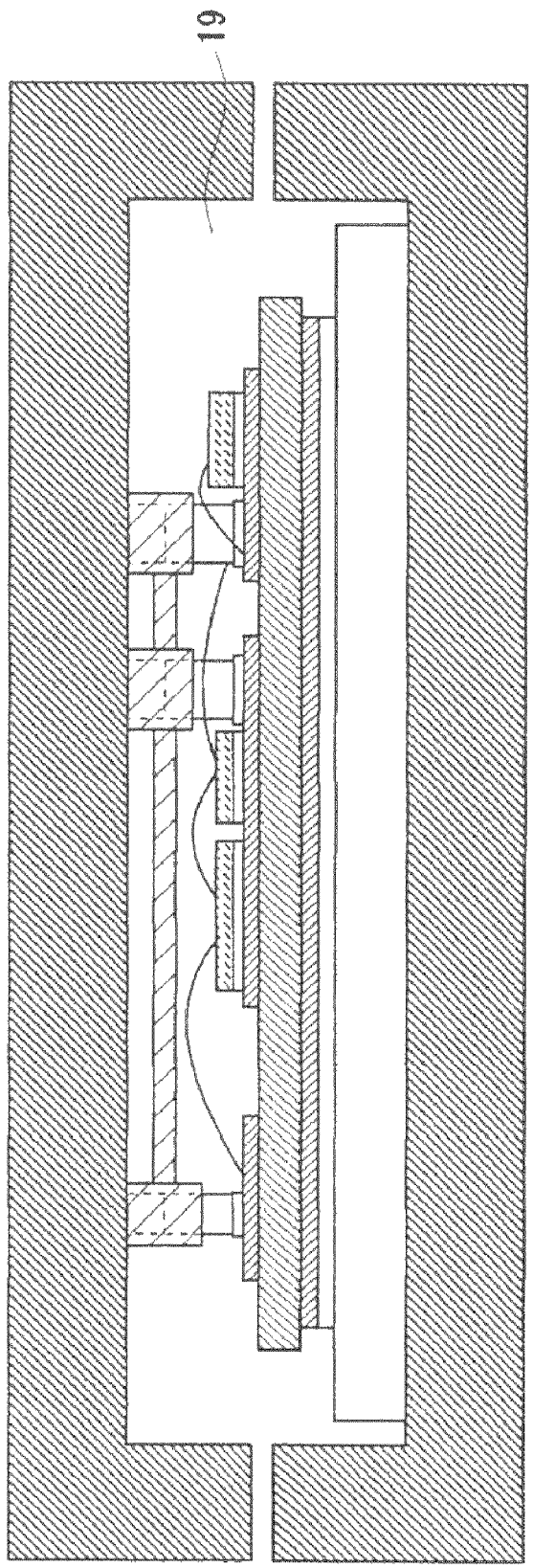
FIG. 9 is yet still another view showing the manufacturing step for the power semiconductor device according to the first preferred embodiment.

FIG. 9 shows a state in which the power semiconductor device is subjected to mold clamping with the upper mold 17 and the lower mold 18. The sleeve parts 9 of the integral resin sleeve 10 are press-fitted to and fitted with the metal socket electrode terminals 8, with the upper surfaces thereof being in contact with an inner wall of the upper mold 17 and the back surface of the base plate 2 being in contact with the inner wall of the lower mold 18.

After the sleeve parts 9 are fitted with the metal socket electrode terminals 8, a distance from the back surface of the base plate 2 to the upper surface of the sleeve part 9 is longer than a distance from the back surface of the base plate 2 to a tip of the metal socket electrode terminal 8. In other words, the sleeve parts 9 of the integral resin sleeve 10 are fitted with the metal socket electrode terminals 8 so that a distance from a bottom of the metal socket electrode terminal 8 to the top of the sleeve part 9 is longer than a length of the metal socket electrode terminal 8 itself in the longitudinal direction.

That is, the sleeve part 9 of the integral resin sleeve 10 is fitted with the metal socket electrode terminal 8 so that the upper surface of the electrode terminal (metal socket electrode terminal 8) is located below the upper surface of the sleeve part 9. Accordingly, constituting members of the power semiconductor device, such as the insulating substrate 1 and the metal socket electrode terminal 8, are not damaged in the mold clamping of the molds.

Next, the molding resin 16 is filled into the cavity 19 through pressurization in a state in which the above-mentioned contact is held, to thereby cure the molding resin 16 through heating. The molds are removed when the molding resin 16 is cured, and a post-curing process is performed if necessary. The power semiconductor device according to the present embodiment is formed as described above.

That is, the manufacturing method for a power semiconductor device according to the first preferred embodiment includes the steps of: (a) preparing a power semiconductor device prior to resin sealing, the power semiconductor device including an insulating substrate 1, a circuit pattern 6 formed on an upper surface of the insulating substrate 1, a power semiconductor 7 formed on the circuit pattern 6, a plurality of electrode terminals 8 formed perpendicularly to the circuit pattern 6 or the power semiconductor 7 so as to be in conduction with external terminals; (b) arranging an integral resin sleeve 10 formed by integrating a plurality of sleeve parts 9 so that the sleeve parts 9 are respectively fitted with the electrode terminals (metal socket electrode terminals 8) corresponding thereto, the plurality of sleeve parts 9 being disposed correspondingly to the plurality of electrode terminals 8 and having openings at both ends thereof; (c) press-fitting the sleeve parts 9 to the metal socket electrode terminals 8 by performing mold clamping on molds 17 and 18 to apply a stress downward on the integral resin sleeve 10; (d) filling a molding resin 16 into a hollow (cavity 19) of the molds 17 and 18 in a state in which upper surfaces of the sleeve parts 9 are in contact with an inner wall of the mold 17; and (e) removing the molds 17 and 18 after the molding resin 16 is cured. The sleeve parts 9 are fitted with the metal socket electrode terminals 8, whereby it is possible to manufacture a power semiconductor device having a top-exposed electrode structure by a transfer molding method without strictly controlling dimensions of the internal components and the molds. Moreover, the plurality of sleeve parts 9 are integrated into the integral resin sleeve 10, whereby it is possible to easily fit the plurality of sleeve parts 9 with the metal socket electrode terminals 8 corresponding thereto.

Further, in the step (c) of press-fitting the sleeve parts 9, the sleeve parts 9 are press-fitted to the metal socket electrode terminals 8 so that the upper surfaces of the metal socket electrode terminals 8 are located below the upper surfaces of the sleeve parts 9. Accordingly, the metal socket electrode terminals 8 are not damaged in the step of performing mold clamping on the molds.

Further, in the step (b) of arranging the integral resin sleeve 10, the integral resin sleeve 10 having a linear expansion coefficient between those of the molding resin and the electrode terminal is used. Accordingly, it is possible to reduce the stress generated in the power semiconductor device in a temperature cycle, which arises from a difference in linear expansion coefficient between the molding resin 16 and the metal socket electrode terminal 8.

(Effects)

As described above, the following effects are achieved by the power semiconductor device according to the present embodiment. That is, the power semiconductor device according to the first preferred embodiment includes: an insulating substrate 1; a circuit pattern 6 formed on an upper surface of the insulating substrate 1; a power semiconductor 7 formed on the circuit pattern 6; a plurality of electrode terminals (metal socket electrode terminals 8) formed perpendicularly to the circuit pattern 6 or the power semiconductor 7 so as to be in conduction with external terminals; an integral resin sleeve 10 in which a plurality of sleeve parts 9 are integrated, the plurality of sleeve parts 9 being respectively fitted with the plurality of electrode terminals 8 from above the plurality of electrode terminals 8 and having openings at both ends thereof; and a sealing resin 16 covering the insulating substrate 1, the circuit pattern 6, the power semiconductor 7, the metal socket electrode terminals 8, and the integral resin sleeve 10. The integral resin sleeve 10 is press-fitted to the metal socket electrode terminals 8 in accordance with the dimension of the inside of the cavity 19 if necessary in the step of performing mold clamping on the molds, and thus there is no need to strictly control thicknesses of the insulating substrate 1, the metal socket electrode terminal 8, and the solder 4. Accordingly, adoption of this structure enables to, in manufacturing a power semiconductor device having a top-exposed electrode structure, avoid an increase in manufacturing cost or a decrease in yield which is caused by strictly controlling the manufacturing step. In addition, the plurality of sleeve parts 9 are integrated into the integral resin sleeve 10, whereby it is possible to easily fit the plurality of sleeve parts 9 with the metal socket electrode terminals 8 corresponding thereto.

Further, upper surfaces of the sleeve parts 9 of the integral resin sleeve 10 are exposed from the molding resin 16. Accordingly, the molding resin 16 does not penetrate into the sleeve parts 9 or the metal socket electrode terminals 8.

Further, the insulating substrate 1 has a multi-layer structure with an undermost layer thereof being a base plate made of metal and a back surface of the base plate being exposed from the molding resin 16. Accordingly, heat dissipation of the power semiconductor 7 and the like is promoted.

Further, ends of the sleeve parts 9, which fitted with the metal socket electrode terminals 8, are tapered in shape. Accordingly, the fitting strength of the sleeve part 9 of the metal socket electrode terminal 8 is improved.

Further, the integral resin sleeve 10 includes the sleeve parts 9 having two or more types of different inner diameters. Accordingly, it is possible to fit the integral resin sleeve 10 with the metal socket electrode terminals having different outer diameters, such as ones for both a signal and a main terminal.

Further, the sleeve parts 9 each include a circular projection on an inner wall thereof. Accordingly, the fitting with the metal socket electrode terminal 8 is strengthened further.

Further, the integral resin sleeve 10 is formed of PPS, PPT, PBT, PET, nylon, polyimide, polyamide-imide, or a resin obtained by reinforcing those with glass fiber. The linear expansion coefficient of the integral resin sleeve 10 is made to be between those of the molding resin 16 and the metal socket electrode terminal 8 thanks to those materials, whereby it is possible to reduce the stress generated in the power semiconductor device in a temperature cycle, which arises from a difference in linear expansion coefficient between the molding resin 16 and the metal socket electrode terminal 8.

Further, the sleeve part 9 has a cylindrical inner shape. Accordingly, it is possible to fit the sleeve part 9 with the metal socket electrode terminal 8 having a cylindrical shape.

Further, the sleeve part 9 has an inner shape of a rectangular tube. Accordingly, it is possible to fit the sleeve part 9 with the metal socket electrode terminal 8 having a rectangular tube shape.

Further, the integral resin sleeve 10 includes a rod-like runner part 11 which couples the plurality of sleeve parts 9. Accordingly, the flexible integral resin sleeve 10 is obtained.

Further, the runner part 11 is embedded in the sealing resin (molding resin 16). Accordingly, adhesiveness between the sleeve part 9 and the molding resin 16 is enhanced, which improves the fitting strength of the sleeve part 9 of the metal socket electrode terminal 8.

Further, a linear expansion coefficient of the integral resin sleeve 10 is between a linear expansion coefficient of the molding resin 16 and a linear expansion coefficient of the metal socket electrode terminal 8. Accordingly, it is possible to reduce the stress generated in the power semiconductor device in a temperature cycle, which arises from a difference in linear expansion coefficient between the molding resin 16 and the metal socket electrode terminal 8.

Further, the sleeve parts 9 of the integral resin sleeve 10 are fitted with the metal socket electrode terminals 8 so that upper surfaces of the electrode terminals (metal socket electrode terminals 8) are located below upper surfaces of the sleeve parts 9. Accordingly, the constituting members of the power semiconductor device, such as the insulating substrate 1 and the metal socket electrode terminal 8, are not damaged in performing mold clamping on the molds.

Further, the power semiconductor device according to the first preferred embodiment includes external terminals which are inserted into or crimped onto the metal socket electrodes terminals 8 from openings of the sleeve parts 9. It is possible to, in the present embodiment, connect the external terminal to the metal socket electrode terminal 8 in this manner.

Further, the insulating substrate 1 is composed of the base plate 2 and a ceramic substrate 3 on which the circuit pattern 6 is formed. Also with the above-mentioned configuration, it is possible to provide a power semiconductor device having a top-exposed electrode structure without strictly controlling dimensions of the internal components and the molds.

Further, the power semiconductor 7 is formed of silicon carbide (SiC). Also with the above-mentioned configuration, it is possible to provide a power semiconductor device having a top-exposed electrode structure without strictly controlling dimensions of the internal components and the molds.

According to the manufacturing method for a power semiconductor device of the present embodiment, the following effects are achieved as described above. That is, the manufacturing method for a power semiconductor device according to the first preferred embodiment includes: the steps of: (a) preparing a power semiconductor device prior to resin sealing, the power semiconductor device including an insulating substrate 1, a circuit pattern 6 formed on an upper surface of the insulating substrate 1, a power semiconductor 7 formed on the circuit pattern 6, and a plurality of electrode terminals 8 formed perpendicularly to the circuit pattern 6 or the power semiconductor 7 so as to be in conduction with external terminals; (b) arranging an integral resin sleeve 10 formed by integrating a plurality of sleeve parts 9 so that the sleeve parts 9 are respectively fitted with the electrode terminals (metal socket electrode terminals 8), the plurality of sleeve parts 9 being disposed correspondingly to the plurality of electrode terminals 8 and having openings at both ends thereof; (c) press-fitting the sleeve parts 9 to the metal socket electrode terminals 8 by performing mold clamping on molds 17 and 18 to apply a force downward on the integral resin sleeve 10; (d) filling a molding resin 16 into a hollow (cavity 19) of the molds 17 and 18 in a state in which upper surfaces of the sleeve parts 9 are in contact with an inner wall of the mold 17; and (e) removing the molds 17 and 18 after the molding resin 16 is cured. Accordingly, in the step of performing mold clamping on the molds, the integral resin sleeve 10 is press-fitted to the metal socket electrode terminals 8 in accordance with the dimension of the inside of the cavity 19 if necessary, with the result that the thicknesses of the insulating substrate 1, the metal socket electrode terminal 8, and the solder 4 do not need to be controlled strictly. Therefore, in manufacturing a power semiconductor device having a top-exposed electrode structure, adoption of this structure enables to avoid an increase in manufacturing cost or a decrease in yield which is caused by strictly controlling the manufacturing step. In addition, the plurality of sleeve parts 9 are integrated into the integral resin sleeve 10, whereby it is possible to easily fit the plurality of sleeve parts 9 with the metal socket electrode terminals 8 corresponding thereto.

Further, in the step (c) of press-fitting the sleeve parts (9), the sleeve parts 9 are press-fitted to the metal socket electrode terminals 8 so that upper surfaces of the metal socket electrode terminals 8 are located below the upper surfaces of the sleeve parts 9. Accordingly, the metal socket electrode terminals 8 are not damaged in the step of performing mold clamping on the molds.

Further, in the step (b) of arranging the integral resin sleeve 10, the integral resin sleeve 10 having a linear expansion coefficient between those of the molding resin and the electrode terminal is used. Accordingly, it is possible to reduce the stress generated in the power semiconductor device in a temperature cycle, which arises from a difference in linear expansion coefficient between the molding resin 16 and the metal socket electrode terminal 8.

Second Preferred Embodiment (Configuration)

Figure 10:
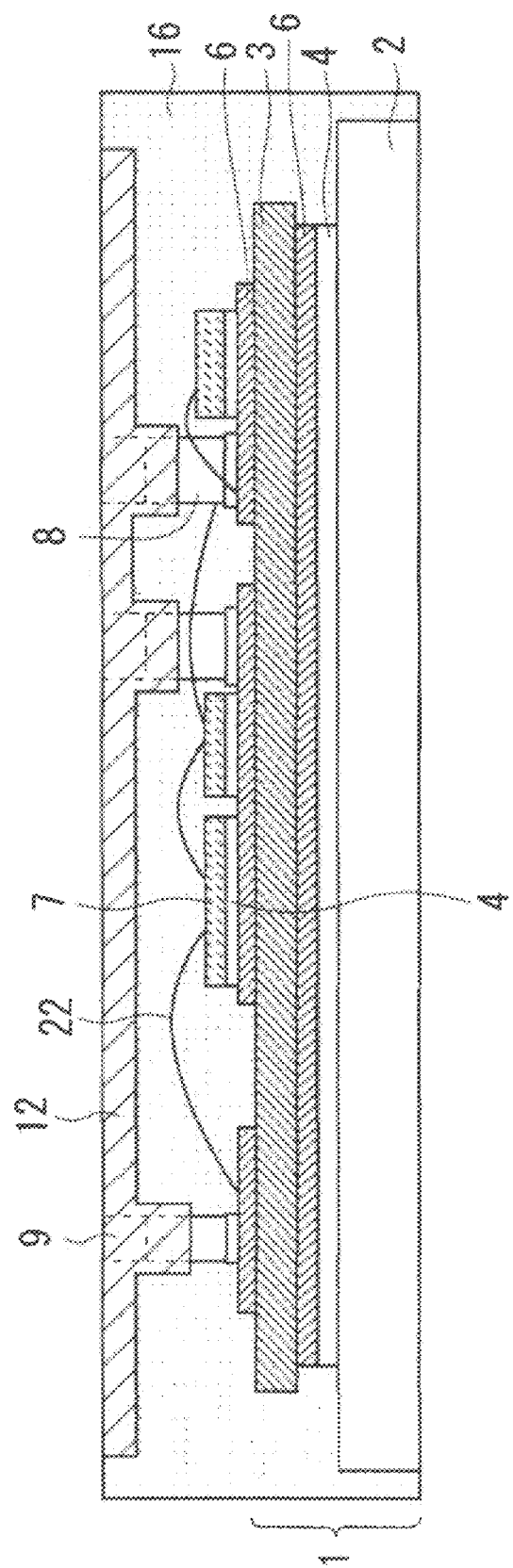
FIG. 10 is a sectional view of a power semiconductor device according to a second preferred embodiment.

FIG. 10 is a sectional view showing a configuration of a power semiconductor device according to a second preferred embodiment. The components similar to those of the first preferred embodiment, which are shown in FIG. 1, are denoted by the same reference numerals. The power semiconductor device according to the second preferred embodiment is different from the power semiconductor device according to the first preferred embodiment in the structure of the integral resin sleeve 10. While the rod-like runner part 11 couples the sleeve parts 9 in the first preferred embodiment, in the second preferred embodiment, a plurality of sleeve parts 9 are formed on a resin flat plate 12 to form the integrate resin sleeve 10, as shown in FIG. 11. The configuration other than this is similar to that of the first preferred embodiment.

That is, the integral resin sleeve 10 has the structure in which a plurality of sleeve parts 9 are formed on the resin flat plate 12. Therefore, relative positions of the plurality of sleeve parts 9 are determined accurately, with the result that the sleeve parts 9 are fitted with the metal socket electrode terminals 8 corresponding thereto without positional deviation.

Further, a surface of the integral resin sleeve 10 formed of the resin flat plate 12, which is on a side opposed to the insulating substrate 1, is exposed from the molding resin 16.

That is, an upper surface of the resin flat plate 12 of the integral resin sleeve 10 is exposed from the molding resin 16. Accordingly, in a case where uneven grooves are provided on the upper surface of the resin flat plate 12, it is possible to prevent the molding resin 16 from penetrating into the grooves in the manufacturing step.

The shape of the integral resin sleeve 10 shown in FIG. 11 is merely an example, and other various variations are conceivable. For example, FIG. 12 is a sectional view of the integral resin sleeve 10 in which a portion of the sleeve part 9 on a side on which the sleeve part 9 is fitted with the metal socket electrode 8 is tapered. Accordingly, fitting performance of the sleeve part 9 with the metal socket electrode terminal 8 is improved.

Alternatively, as shown in FIG. 13, uneven grooves may be provided on a surface of the resin flat plate 12, which is opposed to the insulating substrate 1, other than the sleeve parts 9.

That is, the resin flat plate 12 of the integral resin sleeve 10 is provided with uneven grooves on a surface which is opposed to the insulating substrate 1, other than the sleeve parts 9. Accordingly, adhesiveness between the molding resin 16 and the integral resin sleeve 10 is enhanced. In addition, even if the integral resin sleeve 10 is removed at an interface between the molding resin 16 and the integral resin sleeve 10, it is possible to prevent creeping discharge because a creeping distance between the metal socket electrode terminals 8 on the molding resin 16 becomes longer thanks to the uneven grooves. Accordingly, it is possible to arrange the metal socket electrode terminals 8 on the surface of the molding resin 16 in high density, which leads to miniaturization of a power semiconductor device.

FIG. 14 is a sectional view of the integral resin sleeve 10 in which uneven grooves are provided on side surfaces of the resin flat plate 12.

That is, the resin flat plate 12 of the integral resin sleeve 10 is provided with the uneven grooves on the side surfaces thereof. Accordingly, adhesiveness between the integral resin sleeve 10 and the molding resin 16 is enhanced.

Figure 16:
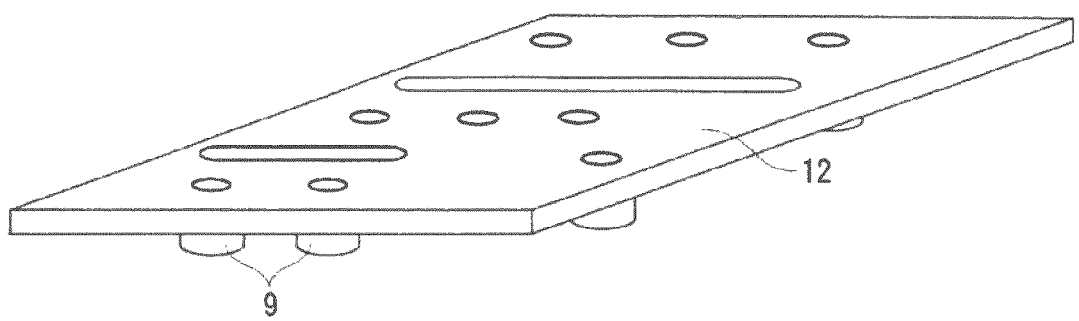
FIG. 16 is a bird's-eye view of the yet still another variation of the integral resin sleeve according to the second preferred embodiment.

FIG. 15 is a sectional view of the integral resin sleeve 10 in which uneven grooves are provided on the upper surface of the resin flat plate 12 exposed from the surface of the molding resin 16, and FIG. 16 is a bird's-eye view thereof.

That is, the resin flat plate 12 of the integral resin sleeve 10 is provided with the uneven grooves on the upper surface thereof. For this reason, it is possible to prevent creeping discharge because a creeping distance between the metal socket electrode terminals 8 on the resin flat plate 12 becomes longer thanks to the uneven grooves formed on the resin flat plate 12. Accordingly, it is possible to arrange the metal socket electrode terminals 8 on the surface of the molding resin 16 in high density, which leads to miniaturization of a power semiconductor device.

(Manufacturing Step)

A manufacturing step for the power semiconductor device according to the second preferred embodiment will be described.

Figure 18:
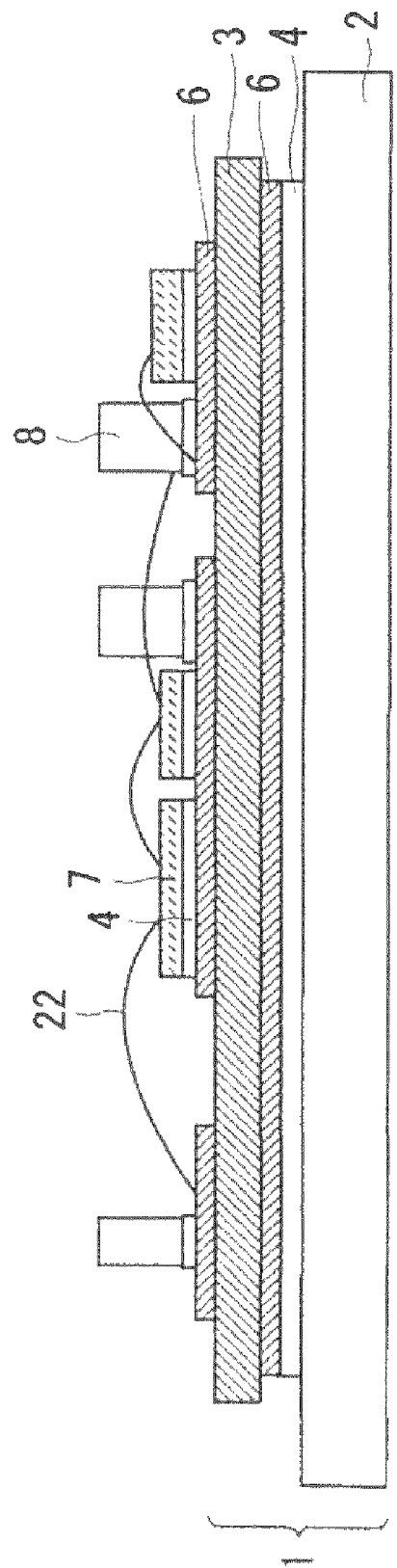
FIG. 18 is a view showing a manufacturing step for the power semiconductor device according to the second preferred embodiment.

First, the ceramic substrate 3 on which the circuit pattern 6 is formed is bonded to the base substrate 1 with the solder 4. After that, the power semiconductor 7 is formed on the circuit pattern 6 of the ceramic substrate 3. Then, the metal socket electrode terminals 8 are formed on the circuit pattern 6 or the power semiconductor 7. The metal socket electrode terminals 8 are formed to extend in a direction perpendicular to the ceramic substrate 3. Then, wire bonding is performed between the power semiconductors 7 or between the circuit pattern and the power semiconductors with the aluminum wire 22. The power semiconductor device in this state is shown in FIG. 18.

Figure 19:
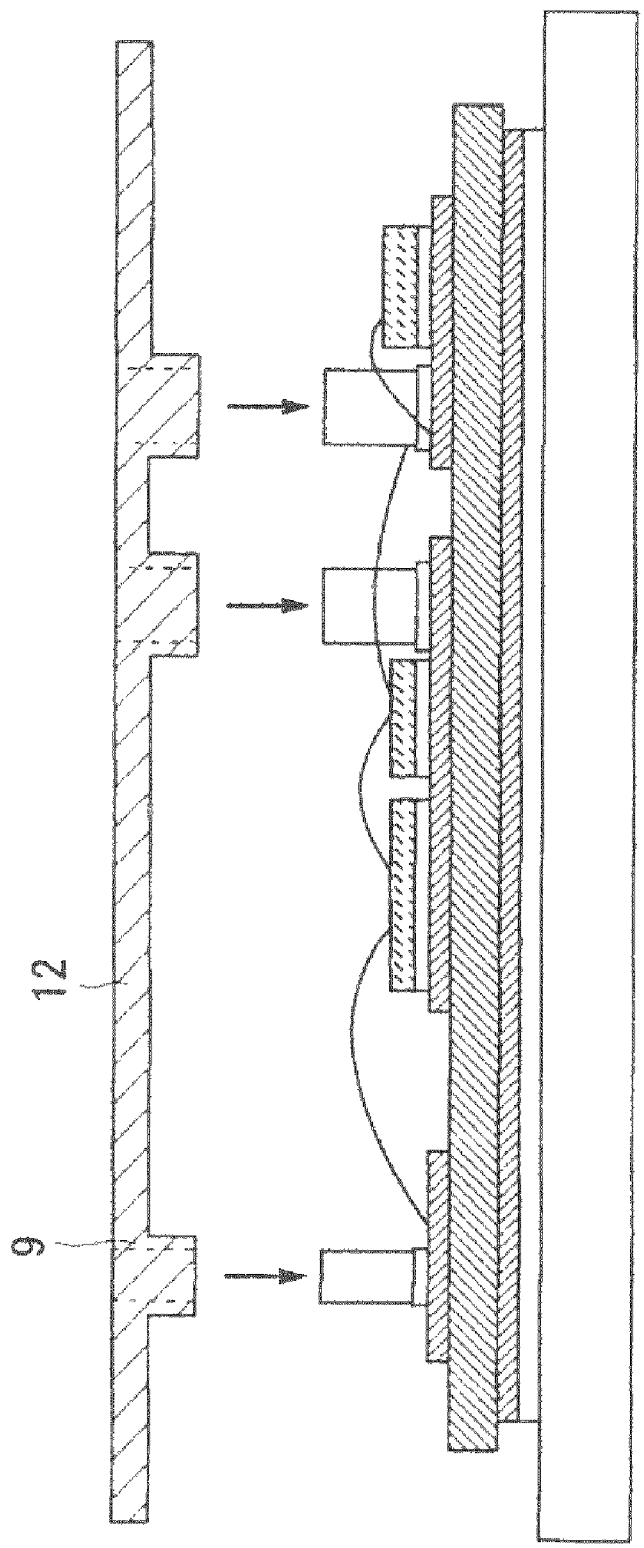
FIG. 19 is another view showing the manufacturing step for the power semiconductor device according to the second preferred embodiment.

Then, the integral resin sleeve 10 is set to the metal socket electrode terminals 8 (FIG. 19). The sleeve parts 9 of the integral resin sleeve 10 are fitted with the metal socket electrode terminals 8, but fitting is performed in mold clamping of the molds in the subsequent step, whereby the integral resin sleeve 10 is temporarily fixed at this stage.

Figure 20:
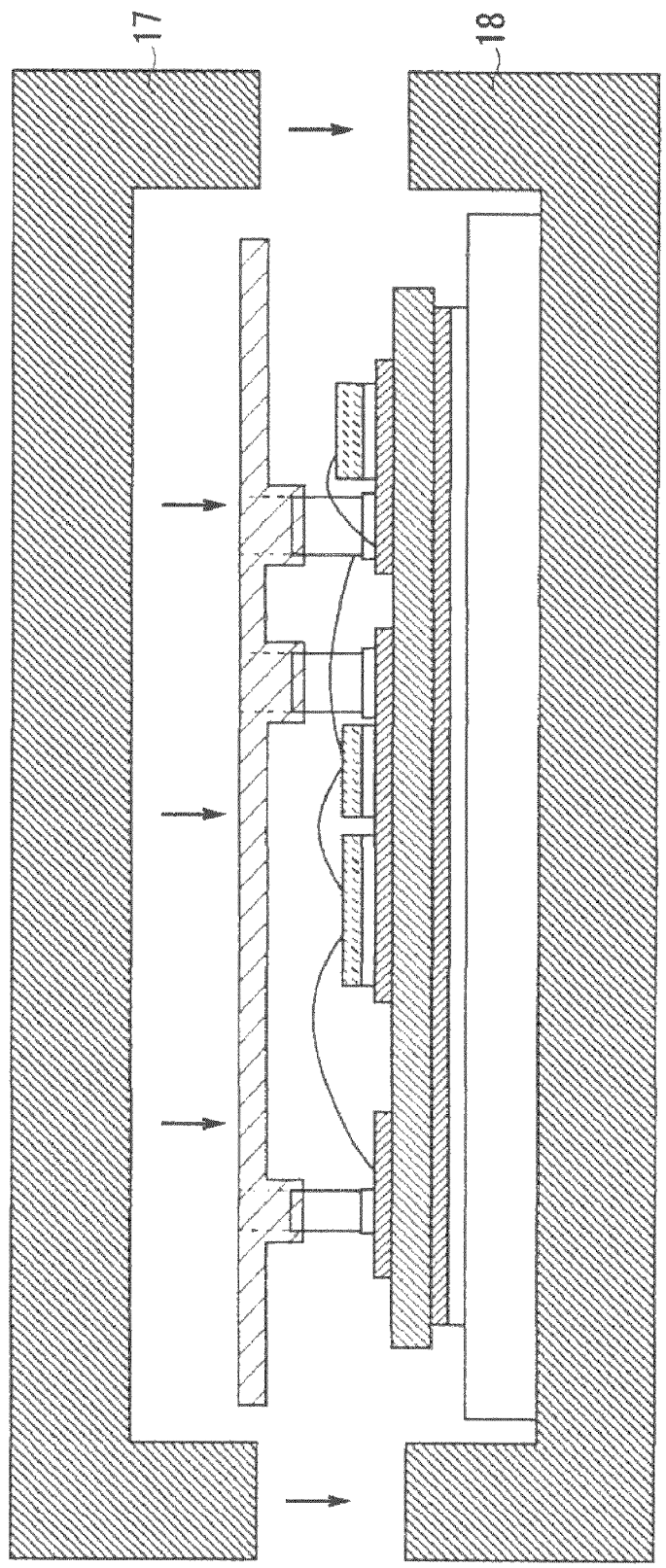
FIG. 20 is still another view showing the manufacturing step for the power semiconductor device according to the second preferred embodiment.

Then, the power semiconductor device in this state, which is a semi-finished product, is placed in the hollow formed by the upper mold 17 and the lower mold 18, that is, the cavity 19 (see FIG. 21), to thereby perform mold clamping on the molds (FIG. 20). On this occasion, the back surface of the base plate 2 is in contact with the inner wall of the lower mold 18. In this case, the distance from the upper end of the metal socket electrode terminal 8 to the base plate 2 is smaller than the length of the inside of the cavity 19 in the longitudinal direction. The integral resin sleeve 10 is pressed downward in the mold clamping step for the upper mold 17 and the lower mold 18, whereby the sleeve parts 9 are respectively fitted with the metal socket electrode terminals 8. The sleeve part 9 is, for example, cylindrical in shape, and is press-fitted to and fitted with the metal socket electrode terminal 8 in the longitudinal direction.

Figure 21:
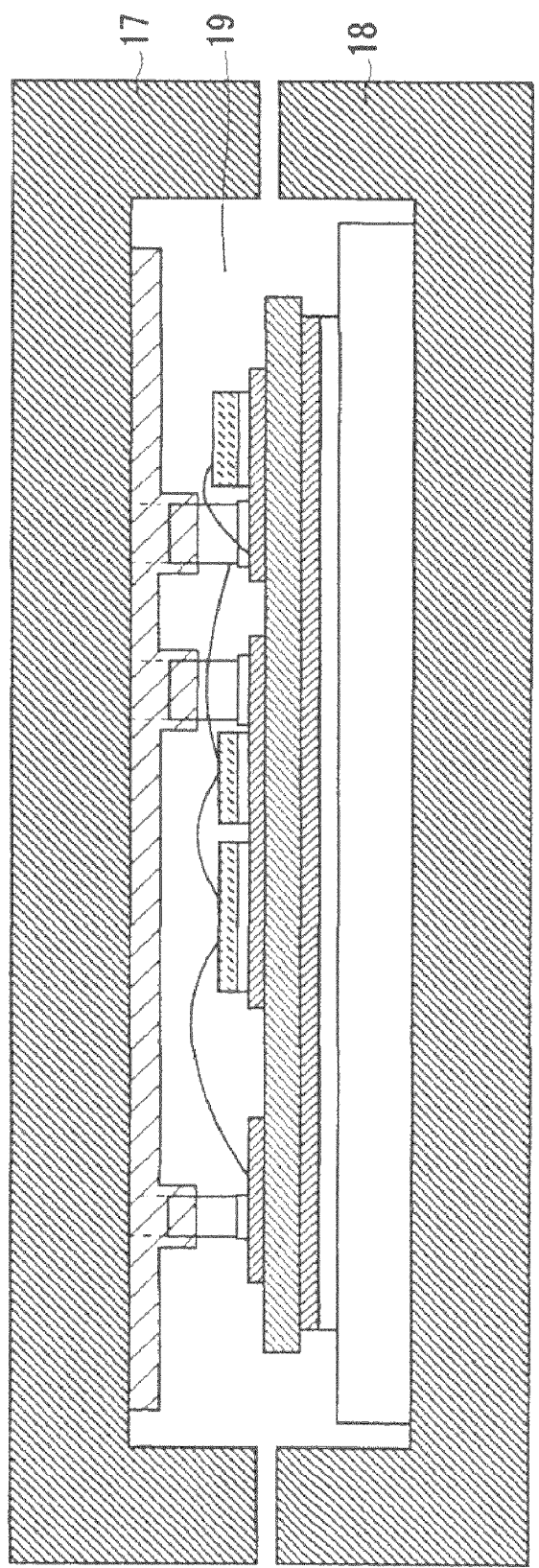
FIG. 21 is yet still another view showing the manufacturing step for the power semiconductor device according to the second preferred embodiment.

FIG. 21 shows the state in which the power semiconductor device is subjected to mold clamping with the upper mold 17 and the lower mold 18. The sleeve parts 9 of the integral resin sleeve 10 are press-fitted to and fitted with the metal socket electrode terminals 8, with the upper surfaces thereof being in contact with the inner wall of the upper mold 17 and the back surface of the base plate 2 being in contact with the inner wall of the lower mold 18.

Figure 17:
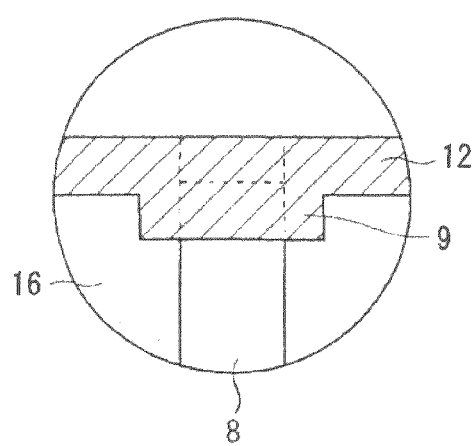
FIG. 17 is an enlarged view of a bonding portion of the integral resin sleeve and the metal socket electrode terminal.

FIG. 17 is an enlarged view of a portion in which the sleeve part 9 of the integral resin sleeve 10 formed of the resin flat plate 12 is fitted with the metal socket electrode terminal 8 corresponding thereto, and the molding resin 16 is filled by the transfer molding method for sealing. The distance from the back surface of the base plate 2 to the upper surface of the sleeve part 9 is longer than the distance from the back surface of the base plate 2 to the tip of the metal socket electrode terminal 8. In other words, the sleeve part 9 of the integral resin sleeve 10 is fitted with the metal socket electrode terminal 8 so that the distance from the bottom of the metal socket electrode terminal 8 to the top of the sleeve part 9 becomes longer than the length of the metal socket electrode terminal 8 itself in the longitudinal direction. As a result, constituting members of the power semiconductor device, such as the insulating substrate 1 and the metal socket electrode terminal 8, are not damaged in performing mold clamping on the molds. Moreover, there is employed the structure in which the top of the metal socket electrode terminal 8 is embedded inside the semiconductor device, and thus the creeping distance between the metal socket electrode terminals 8 becomes longer by a length of the metal socket electrode terminal 8 being embedded, which is advantageous to miniaturization of a power semiconductor device. Note that this effect is also achieved by the integral resin sleeve 10 having a structure in which the sleeve parts 9 are coupled by the runner part 11 which is adopted in the first preferred embodiment.

Then, the molding resin 16 is filled into the cavity 19 through pressurization in the state in which the above-mentioned contact is held, to thereby perform heat curing on the molding resin 16. The mold is removed after the molding resin 16 is cured, and then the post-curing process is performed if necessary. The power semiconductor device according to the present embodiment is formed in this manner.

(Effects)

The power semiconductor device according to the present embodiment produces the following effects in addition to those of the power semiconductor device according to the first preferred embodiment, as described above. That is, the integral resin sleeve 10 has the structure in which a plurality of sleeve parts 9 are formed on the resin flat plate 12. Accordingly, it is possible to determine relative positions of the plurality of sleeve parts 9 with accuracy, whereby the sleeve parts 9 can be fitted with the metal socket electrode terminals 8 corresponding thereto without positional deviation.

Further, the upper surface of the resin flat plate 12 of the integral resin sleeve 10 is exposed from the molding resin 16. Accordingly, in a case where uneven grooves are provided on the upper surface of the resin flat plate 12, it is possible to prevent the molding resin 16 from penetrating into the grooves in the manufacturing step.

Further, the resin flat plate 12 of the integral resin sleeve 10 is provided with uneven grooves on a surface thereof, which is opposed to the insulating substrate 1, other than the sleeve parts 9. Accordingly, adhesiveness between the molding resin 16 and the integral resin sleeve 10 is enhanced. In addition, even if the integral resin sleeve 10 is detached at the interface between the integral resin sleeve 10 and the molding resin 16, the creeping distance between the metal socket electrode terminals 8 on the molding resin 16 becomes longer thanks to the uneven grooves, which prevents creeping discharge. Accordingly, it is possible to arrange the metal socket electrode terminals 8 on the surface of the molding resin 16 in high density, enabling miniaturization of a power semiconductor device.

Further, the resin flat plate 12 of the integral resin sleeve 10 is provided with uneven grooves on side surfaces thereof. Accordingly, adhesiveness between the integral resin sleeve 10 and the molding resin 16 is enhanced.

Moreover, the resin flat plate 12 of the integral resin sleeve 10 is provided with uneven grooves on the upper surface thereof. Thanks to the uneven grooves formed on the resin flat plate 12, it is possible to prevent creeping discharge because a creeping distance between the metal socket electrode terminals 8 on the resin flat plate 12 becomes longer. Accordingly, it is possible to arrange the metal socket electrode terminals 8 on the surface of the molding resin 16 in high density, which enables miniaturization of a power semiconductor device.

Third Preferred Embodiment (Configuration)

Figure 22:
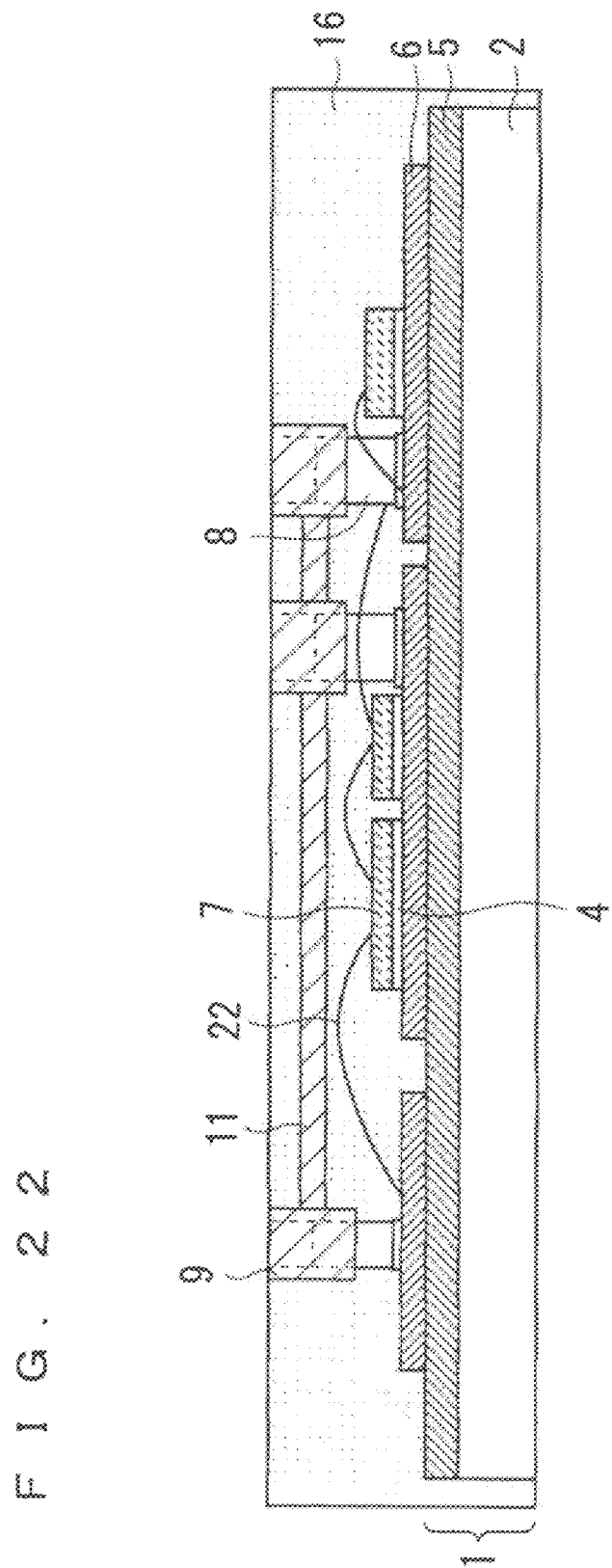
FIG. 22 is a sectional view of a power semiconductor device according to a third preferred embodiment.

FIG. 22 is a sectional view showing a configuration of a power semiconductor device according to a third preferred embodiment. The components similar to those of the first preferred embodiment shown in FIG. 1 are denoted by the same reference numerals. In the power semiconductor device according to the third preferred embodiment, an insulating heat-conductive sheet 5 is used in place of the ceramic substrate 3 used in the power semiconductor device according to the first preferred embodiment. The base plate 2 and the circuit pattern 6 are integrated through the insulating heat-conductive sheet 5. The configuration other than this is similar to that of the first preferred embodiment, and therefore its description is omitted.

(Effect)

In the power semiconductor device according to the third preferred embodiment, the insulating substrate 1 is composed of the base plate 2 and the insulating heat-conductive sheet 5 on which the circuit pattern 6 is formed. Also with the above-mentioned configuration, it is possible to provide a power semiconductor device having a top-exposed electrode structure without strictly controlling dimensions of the internal components and the molds, as in the first preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, comprising:
   an insulating substrate;
   a circuit pattern formed on an upper surface of said insulating substrate;
   a power semiconductor formed on said circuit pattern;
   a plurality of electrode terminals formed perpendicularly to one of said circuit pattern and said power semiconductor so as to be in conduction with external terminals;
   an integral resin sleeve in which a plurality of sleeve parts are integrated, the plurality of sleeve parts being respectively fitted with said plurality of electrode terminals from above the plurality of electrode terminals and having openings at both ends thereof; and
   a sealing resin covering said insulating substrate, said circuit pattern, said power semiconductor, said electrode terminals, and said integral resin sleeve,
   wherein:
   upper surfaces of said sleeve parts of said integral resin sleeve are exposed from said sealing resin,
   said insulating substrate has a multi-layer structure with an undermost layer thereof being a base plate made of metal,
   a back surface of said base plate is exposed from said sealing resin,
   said integral resin sleeve has a structure in which said plurality of sleeve parts are formed on a resin flat plate,
   an upper surface of said resin flat plate of said integral resin sleeve is exposed from said sealing resin, and
   said resin flat plate of said integral resin sleeve is provided with uneven grooves on a surface opposed to said insulating substrate other than said sleeve parts.

2. The power semiconductor device according to claim 1, wherein ends of said sleeve parts are tapered in shape, the ends being fitted with said electrode terminals.

3. The power semiconductor device according to claim 1, wherein said integral resin sleeve includes said sleeve parts having two or more types of different inner diameters.

4. The power semiconductor device according to claim 1, wherein said sleeve parts each include a circular projection on an inner wall thereof.

5. The power semiconductor device according to claim 1, wherein said integral resin sleeve is formed of one of poly (phenylene sulfide) (PPS), polypropylene terephthalate (PPT), polybutylene terephthalate (PBT), polyethylene terephthalate (PET), nylon, polyimide, polyamide-imide, and a resin obtained by reinforcing those with glass fiber.

6. The power semiconductor device according to claim 1, wherein said sleeve parts each have a cylindrical inner shape.

7. The power semiconductor device according to claim 1, wherein said sleeve parts each have an inner shape of a rectangular tube.

8. The power semiconductor device according to claim 1, wherein a linear expansion coefficient of said integral resin sleeve is between a linear expansion coefficient of said sealing resin and a linear expansion coefficient of said electrode terminal.

9. The power semiconductor device according to claim 1, wherein said sleeve parts of said integral resin sleeve are fitted with said electrode terminals so that upper surfaces of said electrode terminals are located below upper surfaces of said sleeve parts.

10. The power semiconductor device according to claim 1, further comprising external terminals which are one of inserted into and press-fitted to said electrode terminals from the openings of said sleeve parts.

11. The power semiconductor device according to claim 1, wherein said insulating substrate includes said base plate and a ceramic substrate on which said circuit pattern is formed.

12. The power semiconductor device according to claim 1, wherein said insulating substrate includes said base plate and an insulating heat-conductive sheet on which said circuit pattern is formed.

13. The power semiconductor device according to claim 1, wherein said power semiconductor is formed of silicon carbide (SiC).

14. A power semiconductor device, comprising:
    an insulating substrate;
    a circuit pattern formed on an upper surface of said insulating substrate;
    a power semiconductor formed on said circuit pattern;
    a plurality of electrode terminals formed perpendicularly to one of said circuit pattern and said power semiconductor so as to be in conduction with external terminals;
    an integral resin sleeve in which a plurality of sleeve parts are integrated, the plurality of sleeve parts being respectively fitted with said plurality of electrode terminals from above the plurality of electrode terminals and having openings at both ends thereof; and
    a sealing resin covering said insulating substrate, said circuit pattern, said power semiconductor, said electrode terminals, and said integral resin sleeve,
    wherein:
    upper surfaces of said sleeve parts of said integral resin sleeve are exposed from said sealing resin,
    said insulating substrate has a multi-layer structure with an undermost layer thereof being a base plate made of metal,
    a back surface of said base plate is exposed from said sealing resin,
    said integral resin sleeve has a structure in which said plurality of sleeve parts are formed on a resin flat plate,
    an upper surface of said resin flat plate of said integral resin sleeve is exposed from said sealing resin, and
    said resin flat plate of said integral resin sleeve is provided with uneven grooves on side surfaces thereof.

15. A power semiconductor device, comprising:
    an insulating substrate;
    a circuit pattern formed on an upper surface of said insulating substrate;
    a power semiconductor formed on said circuit pattern;
    a plurality of electrode terminals formed perpendicularly to one of said circuit pattern and said power semiconductor so as to be in conduction with external terminals;

an integral resin sleeve in which a plurality of sleeve parts are integrated, the plurality of sleeve parts being respectively fitted with said plurality of electrode terminals from above the plurality of electrode terminals and having openings at both ends thereof; and a sealing resin covering said insulating substrate, said circuit pattern, said power semiconductor, said electrode terminals, and said integral resin sleeve, wherein:

upper surfaces of said sleeve parts of said integral resin sleeve are exposed from said sealing resin, said insulating substrate has a multi-layer structure with an undermost layer thereof being a base plate made of metal, a back surface of said base plate is exposed from said sealing resin, said integral resin sleeve has a structure in which said plurality of sleeve parts are formed on a resin flat plate, an upper surface of said resin flat plate of said integral resin sleeve is exposed from said sealing resin, and said resin flat plate of said integral resin sleeve is provided with uneven grooves on an upper surface thereof.

* * * * *